(12) United States Patent
Levy

(10) Patent No.: US 10,306,516 B2
(45) Date of Patent: May 28, 2019

(54) RATE MATCHING FOR WIRELESS COMMUNICATION

(71) Applicant: Ceva D.S.P. Ltd., Herzlia Pituach (IL)

(72) Inventor: David Levy, Raanana (IL)

(73) Assignee: Ceva D.S.P. Ltd., Herzlia Pituach (IL)

( * ) Notice: Subject to any disclaimer, the term of this patent is extended or adjusted under 35 U.S.C. 154(b) by 23 days.

(21) Appl. No.: 15/438,823

(22) Filed: Feb. 22, 2017

(65) Prior Publication Data

US 2018/0242200 A1     Aug. 23, 2018

(51) Int. Cl.
| | |
|---|---|
| H04W 28/22 | (2009.01) |
| H04L 29/06 | (2006.01) |
| H03M 13/27 | (2006.01) |
| H03M 13/29 | (2006.01) |
| H03M 13/00 | (2006.01) |
| H04L 1/00 | (2006.01) |

(52) U.S. Cl.
CPC ......... *H04W 28/22* (2013.01); *H03M 13/271* (2013.01); *H03M 13/2957* (2013.01); *H03M 13/635* (2013.01); *H03M 13/6525* (2013.01); *H04L 1/0013* (2013.01); *H04L 69/22* (2013.01)

(58) Field of Classification Search
CPC ..... H04W 28/22; H04W 28/18; H04W 28/16; H04L 69/22
USPC ......................................... 370/503
See application file for complete search history.

(56) References Cited

U.S. PATENT DOCUMENTS

| | | |
|---|---|---|
| 8,433,987 B2 | 4/2013 | Fan et al. |
| 8,446,300 B2 | 5/2013 | Reinhardt |

(Continued)

FOREIGN PATENT DOCUMENTS

| | | |
|---|---|---|
| CN | 101944972 | 4/2013 |
| EP | 2 150 001 | 2/2010 |

(Continued)

OTHER PUBLICATIONS

J. C. Lin and Y. H. Hu, "Efficient implementation of bit-rate matching for LTE-A with sub-matrix transpose technique," *2013 IEEE China Summit and International Conference on Signal and Information Processing*, Beijing, Jul. 6, 2013; pp. 580-583.

(Continued)

*Primary Examiner* — Kwang B Yao
*Assistant Examiner* — Syed M Bokhari
(74) *Attorney, Agent, or Firm* — Pearl Cohen Zedek Latzer Baratz LLP

(57) ABSTRACT

A method and a logic circuit for rate matching for three equally sized bit streams, including: prepending each of the bit streams with null bits; permuting the first two bit streams according to a first permutation pattern; permuting the third bit stream based on the first permutation pattern; transposing the three bit streams; shuffling the second and third bit streams; removing the null bits from the first bit stream and from the shuffled bit stream, wherein location of the null bits in the first bit stream is based only on a number of prepended null bits and the first permutation pattern and location of the null bits in the shuffled bit stream is based only on the number of prepended null bits, the first permutation pattern, and a null index related to the number of prepended null bits; and generating a combined bit stream from the three bit streams.

20 Claims, 13 Drawing Sheets

(56) References Cited

U.S. PATENT DOCUMENTS

2010/0235721 A1    9/2010   Bukris et al.
2012/0163211 A1*   6/2012   Kim ..................... H04L 1/0067
                                                                        370/252

FOREIGN PATENT DOCUMENTS

WO    WO 2008/117994    10/2008
WO    WO 2011/091672     8/2011

OTHER PUBLICATIONS

Yoo, B. Kim and I. C. Park "Reverse Rate Matching for Low-Power LTE-Advanced Turbo Decoders," *IEEE Transactions on Circuits and Systems I: Regular Papers*, vol. 62, No. 12, pp. 2920-2928, Dec. 1, 2015.
He, Suqin et al. "Implementation of Rate Matching with Low Latency and Little Memory for LTE Turbo Code." Journal of Information and Computational Science. Sep. 1, 2013; vol. 10. No. 13; pp. 4117-4125.
3rd Generation Partnership Project (3GPP) "Evolved Universal Terrestrial Radio Access (E-UTRA); Multiplexing and channel coding." Sep. 22, 2015; vol. 10.9.0; pp. 1-79.
Samsung 3rd Generation Partnership Project (3GPP) "Implementation Considerations for Circular Buffer Rate Matching." May 7-11, 2007.
Extended European Search Report for App. No. EP18156817.1 dated Apr. 26, 2017.

* cited by examiner

| COL 0 |
| COL 16 |
| COL 24 |
| COL 8 |
| COL 28 |
| COL 12 |
| COL 20 |
| COL 4 |
| COL 30 |
| COL 14 |
| COL 22 |
| COL 6 |
| COL 26 |
| COL 10 |
| COL 18 |
| COL 2 |
| COL 31 |
| COL 15 |
| COL 23 |
| COL 7 |
| COL 27 |
| COL 11 |
| COL 19 |
| COL 3 |
| COL 29 |
| COL 13 |
| COL 21 |
| COL 5 |
| COL 25 |
| COL 9 |
| COL 17 |
| COL 1 |

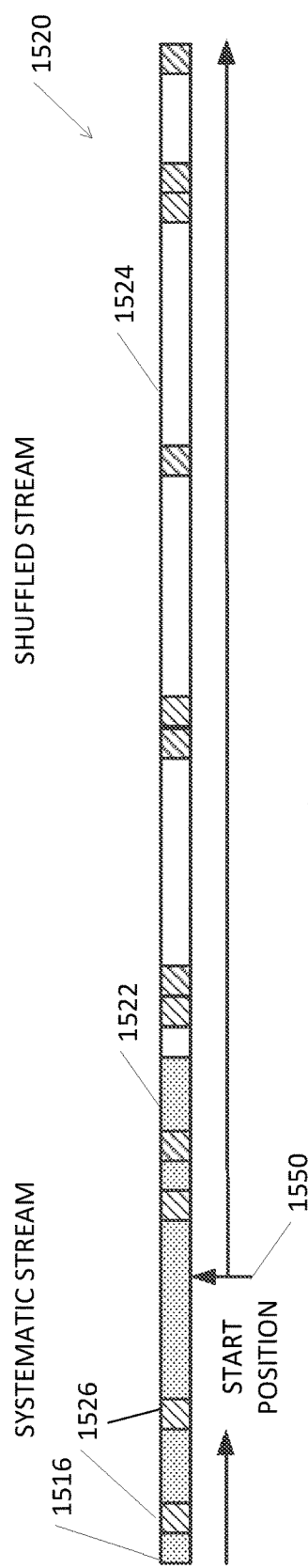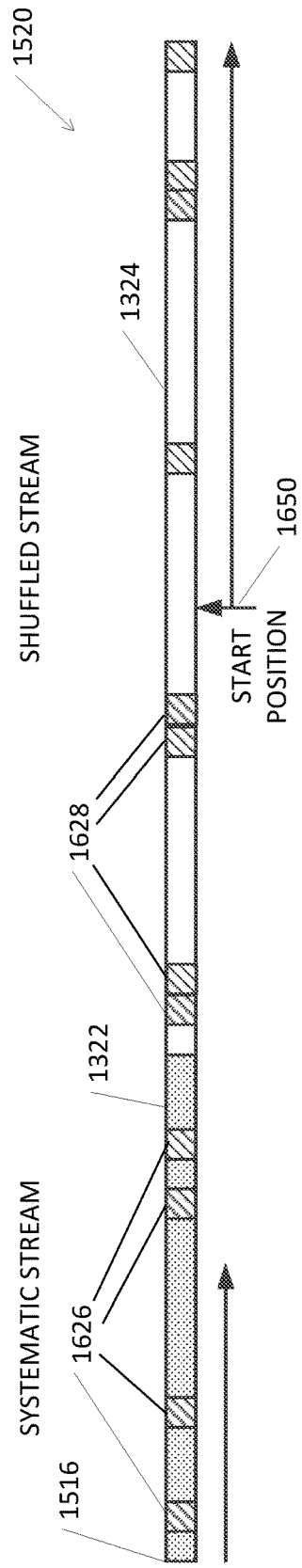

RATE MATCHING FOR WIRELESS COMMUNICATION

FIELD OF THE INVENTION

The present invention relates generally to the field of rate matching for wireless communications, for example efficient removal of null bits inserted while performing rate matching.

BACKGROUND

A widely adopted standard for wireless communication is the 3rd Generation Partnership Project (3GPP) standard. The 3GPP standard has had many revisions, including an evolution into the Long-Term Evolution (LTE) standards. The LTE standards also continue to evolve, such that there are multiple releases, one of which is the LTE standards Release 12 (e.g., Rel-12).

The LTE standard includes a specification of a rate matching block or module, both at the physical layer at the transmitter of the base station (e.g., an evolved NodeB or eNB) and at the physical layer at the transmitter of the user equipment (UE). Rate matching is performed over code blocks after turbo encoding. An LTE turbo encoder provides three output streams of the same length for each input stream, the first stream being the original input stream called a systematic stream, and the remaining two streams are interleaved versions of the input stream called parity 1 and parity 2 streams. These three streams are the input of the rate matching block.

At the rate matching block each of the three bit streams may be arranged into a matrix, C, having 32 columns by R rows. If the number of bits, D, at each of the three bit streams is not divisible by 32, each stream may be prepended with null bits so that each will contain full double words, e.g., a double word contains 32 bits and after prepending the number of bits in each of the three bit streams is a divisible by 32. The data may then undergo a series of operations which modify the order of the bits: permutation, transposition, bit shuffling and bit selection. Bit selection may include pointing to a starting point of a combined bit stream (e.g., a data stream that includes all three data streams) and removing the null bits. The starting point is typically not at the beginning of the combined bit stream. The combined bit stream, starting at the starting point and without the null bits, may then be forwarded to the next block at the transmitter.

Known systems mark the null bits when they are inserted, before the permutation, and remove them in the bit selection sub-block, after all bit ordering operations are done. However, marking costs in more memory accesses and longer processing time required for the series of operations performed at the rate matching block. One marking method includes using a full byte to represent a single bit of data. Another bit in this byte indicates if the bit is a null bit. Clearly, this method is very inefficient in terms of memory usage and processing time.

SUMMARY OF THE INVENTION

Embodiments of the present invention may include a method and a logic circuit for rate matching for three equally sized bit streams, including for example prepending each of the three bit streams with null bits; permuting the first two bit streams according to a first permutation pattern; permuting the third bit stream based on the first permutation pattern; transposing the three bit streams; shuffling the second and the third bit streams to generate a shuffled bit stream; removing the null bits from the first bit stream, wherein location of the null bits in the first bit stream is based only on a number of prepended null bits and the first permutation pattern; removing the null bits from the shuffled bit stream, wherein location of the null bits in the shuffled bit stream is based only on the number of prepended null bits, the first permutation pattern, and a null index related to the number of prepended null bits; and generating a combined bit stream from the three bit streams.

Furthermore, according to embodiments of the present invention, removing the null bits from the shuffled bit stream may include: removing a last bit in a last row of the shuffled bit stream; and in all rows of the shuffled bit stream except for the last row: if a value in the first permutation pattern corresponding to a row number is smaller than the number of prepended null bits, then if the row number equals the null index, removing a first bit in the row, and if the row number does not equal the null index removing a first two bits in the row.

Furthermore, according to embodiments of the present invention, permutation of the third stream may be performed according to a formula.

Furthermore, according to embodiments of the present invention, permutation of the third bit stream may include: permuting the third bit stream according to a second permutation pattern; and after transposing, performing one left cyclic rotation on a last row of the third bit stream.

Furthermore, according to embodiments of the present invention, the second permutation pattern may be related to the first permutation pattern such that in the shuffled bit stream null bits of the second and third bit streams are located at the same rows, except in the last row in which the last bit is a null bit, and a single row in which there is only a single null bit.

Furthermore, embodiments of the present invention may include: obtaining a standard starting position for transmission of the combined bit stream, wherein the standard starting position is correct for a standard combined bit stream which includes the null bits; and moving a location of the standard starting position to compensate for the removal of the null bits, to obtain a modified starting position.

Furthermore, embodiments of the present invention may include determining in which row the standard starting position is located; if the standard starting position is within the first bit stream, moving the standard starting position towards a beginning of the combined bit stream by a number of null bits that were present in the first bit stream after transposing from the beginning of the first bit stream and up to the row in which the standard starting position is located; if the standard starting position is within the shuffled bit stream, moving the standard starting position towards the beginning of the combined bit stream by a number of prepended null bits plus two times a number of null bits that were present in the second bit stream after transposing from the beginning of the second bit stream and up to the row in which the standard starting position is located; and if a number of null bits that were present in the second bit stream after transposing from the beginning of the second bit stream and up to the row in which the standard starting position is located is larger or equal to the null index, moving the standard starting position away from the beginning of the combined bit stream by one.

Furthermore, according to embodiments of the present invention, the row in which the standard starting position is located may be calculated by: if the standard starting position is smaller than the number of bits in the first bit stream then the row in which the standard starting position is located equals an integer part of dividing the standard starting position by the number of rows in the first bit stream; and otherwise, the row in which the standard starting position is located equals $B+(K-B*R)/(2*R)$, where K is the standard starting position, R is the number of rows, and B is a number of bits in each row in the first bit stream.

Furthermore, embodiments of the present invention may include transmitting the combined bit stream starting from the corrected starting position.

Furthermore, according to embodiments of the present invention, the first bit stream may be a systematic bit stream, the second bit stream may be a parity 1 bit stream and the third bit stream may be a parity 2 bit stream.

Embodiments of the present invention may include a method and a logic circuit for rate matching for three equally sized bit streams, including, for example, prepending each of the three bit streams with null bits; permuting the first two bit streams according to a first permutation pattern; permuting the third bit stream according to a second permutation pattern; transposing the three bit streams; shuffling the second and the third bit streams to generate a shuffled bit stream; removing the null bits from the first bit stream, wherein location of the null bits in the first bit stream is based only on a number of prepended null bits and the first permutation pattern; removing the null bits from the shuffled bit stream, wherein location of the null bits in the shuffled bit stream is based only on the number of prepended null bits, the first permutation pattern, and the second permutation table; and generating a combined bit stream from the three bit streams.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 5 depicts an exemplary matrix C of parity 2 bit stream that has been prepended with 21 null bits, after permutation, helpful in demonstrating embodiments of the present invention;

FIG. 15 depicts a combined bit stream that was generated without removing the null bits, with a standard starting position in the systematic bit stream helpful in demonstrating embodiments of the present invention;

FIG. 16 depicts a combined bit stream that was generated without removing the null bits with a standard starting position in the shuffled bit stream, helpful in demonstrating embodiments of the present invention.

Figure 1:
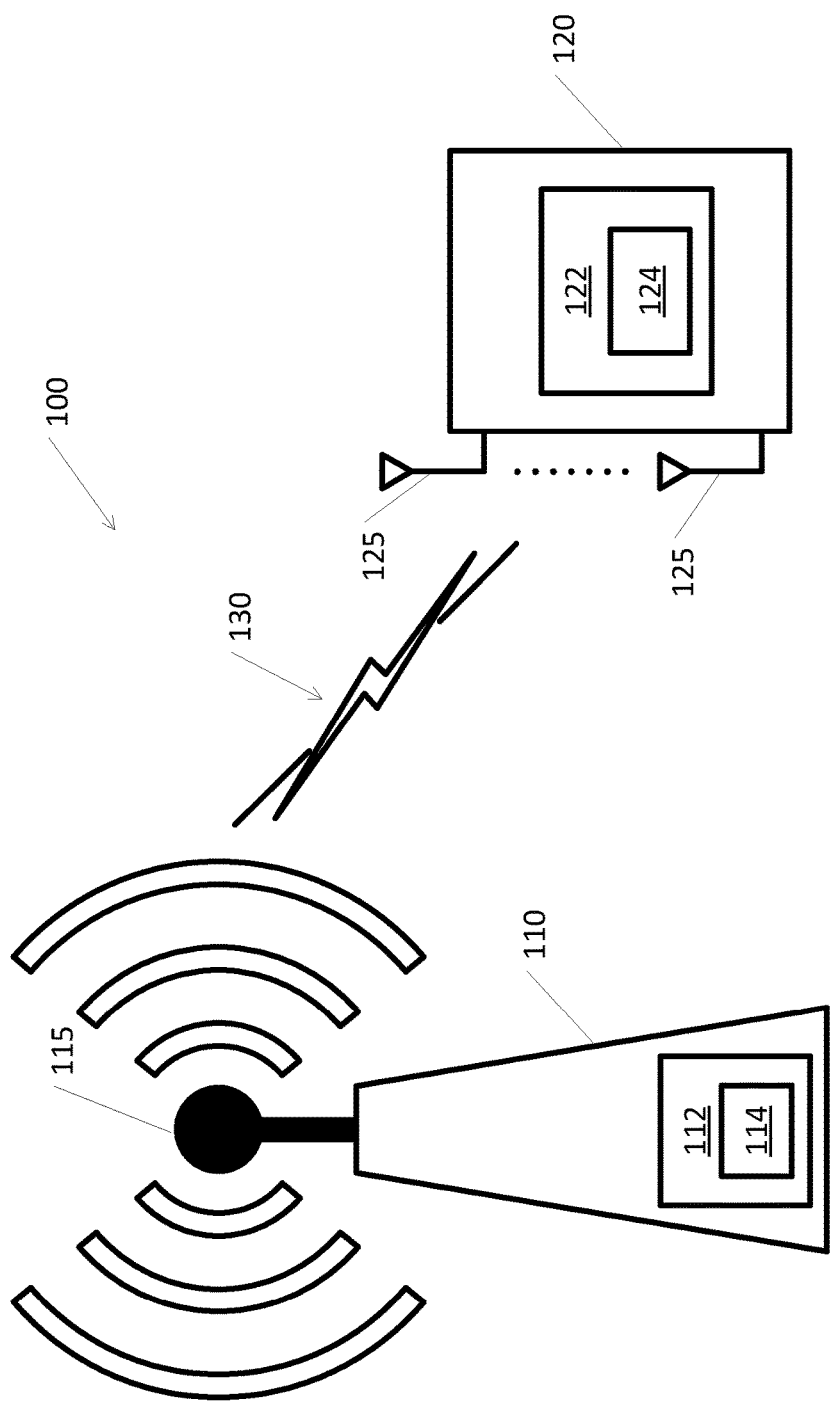
FIG. 1 is a schematic illustration of an exemplary cellular communications system, according to embodiments of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following description, various aspects of the present invention will be described. For purposes of explanation, specific configurations and details are set forth in order to provide a thorough understanding of the present invention. However, it will also be apparent to one skilled in the art that the present invention may be practiced without the specific details presented herein. Furthermore, well known features may be omitted or simplified in order not to obscure the present invention.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention will now be demonstrated in detail, and specific example will be given with reference to LTE rel. 12. However, it will be apparent to these skilled in the art that embodiments of the present invention are not limited in this regard. Embodiments of the present invention may apply to other standards, or other releases of the LTE standards. For example, embodiments of the present invention may be used in Narrow Band Internet of Things (NB-IoT) section of LTE rel. 12.

Reference is now made to FIG. 1 which is a schematic illustration of an exemplary cellular communications system 100, according to embodiments of the invention. Cellular communications system 100 includes a base station 110, e.g., an evolved NodeB (eNB) or another device, of a serving cell, and UE 120. UE 120 may refer to any device used to communicate over a wireless communication network. UE 120 may be or may include, for example, computing devices having mobile broadband communication capabilities, e.g., a hand-held telephone or smartphone, a laptop computer equipped with a mobile broadband adapter, an IoT device or a Machine Type Communication (MTC) device, e.g., environment or industrial remote sensors, domestic sensors, wearables, etc. As is apparent to one of ordinary skill in the art, serving cell 110 and UE 120 are not drawn to scale and are illustrative only.

UE 120 may include a transmitter 122 and a plurality of antennae 125 for transmitting and receiving cellular communications signals, e.g., transmission 130 to serving cell 110. Serving cell 110 may include a transmitter 112 and a plurality of antennae 115 for transmitting and receiving cellular communications signals, e.g., transmission 130, to UE 120.

Each of transmitter 122 and transmitter 112 may include a rate matching block, e.g., rate matching block 124 and rate matching block 114, respectively. Rate matching blocks 124, 114 may receive three bit streams of the same length, typically referred to as the systematic, parity 1 and parity 2 bit streams. As disclosed herein, rate matching blocks 114, 124 may perform a series of operations on the three bit streams before forwarding the data, typically in the form of a combined bit stream, to the next block of the transmitter 122, 112.

Figure 2:
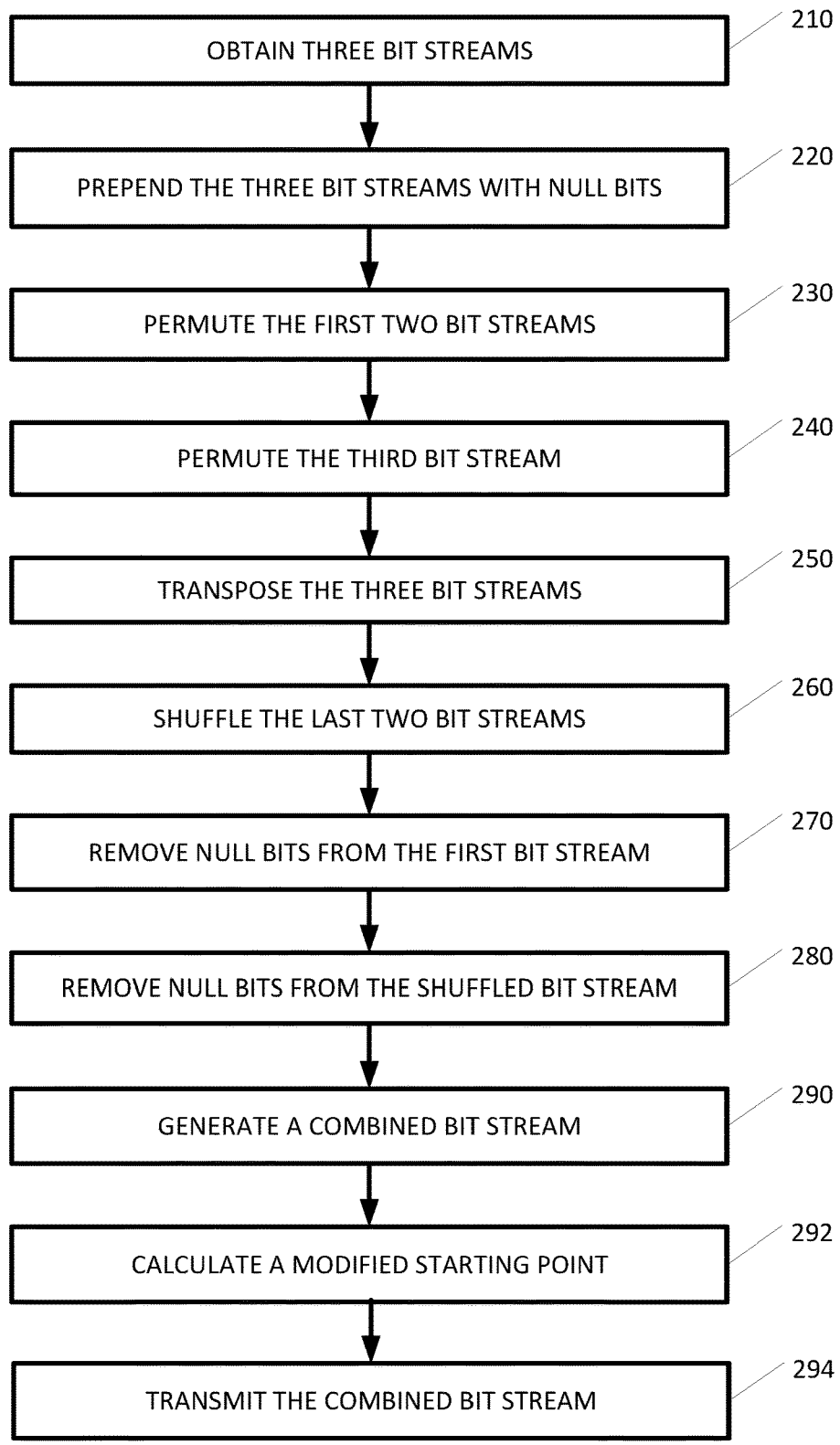
FIG. 2 is a flowchart diagram illustrating a method for rate matching, according to embodiments of the present invention.

Reference is now made to FIG. 2, which is a flowchart diagram illustrating a method for rate matching, according to embodiments of the present invention. According to some embodiments, rate matching may be performed by any suitable processor, for example, processor 1710 depicted in FIG. 17, and initiated by a set of commands or instructions. Base station 110, UE 120 or other equipment shown in FIG. 1 may be or include the components shown in FIG. 17, or other components. According to some embodiments, rate matching may be performed by a UE, for example, UE 120. According to some embodiments, rate matching may be performed by a base station, for example, base station 110.

In operation 210 three bit streams e.g., the systematic, parity 1 and parity 2 bit streams, may be obtained. Each of the three bit streams may be arranged into a matrix, C, having 32 columns. The number of rows in each matrix may be denoted R. Typically, the three bit streams are equally sized. As known, the three bit streams may be generated by a turbo encoding block (not shown) of the LTE transmitter. The turbo encoder may generate three output bits streams for every input bit stream. The first bit stream may be the original input bit stream called a systematic bit stream and the other bit streams may be interleaved versions of the input bit stream called parity 1 and parity 2 bit streams.

Figure 3:
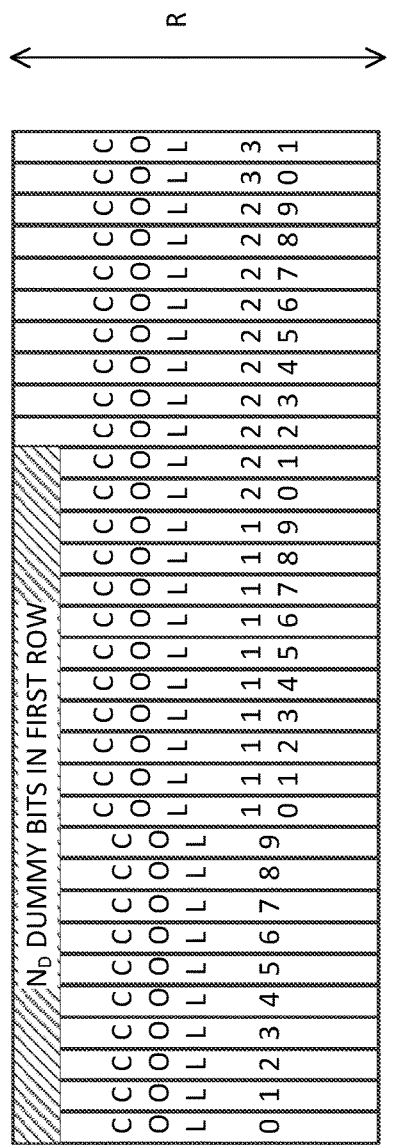
FIG. 3 depicts an exemplary matrix C of a bit stream that has been prepended with 21 null bits, helpful in demonstrating embodiments of the present invention.

In operation 220 each of the three bit streams may be prepended with null bits or dummy bits, e.g., padding bits whose value is insignificant. Each of the three bit streams may be prepended with null bits (e.g. the bits may be added before the beginning of the stream) so that each will contain full double words, e.g., a double word contains 32 bits and after prepending the number of bits in each of the three bit streams is a product of 32. Technically, the three bit streams may be prepended with any number of null bits, up to 31 null bits. However, some standards, for example the LTE standard, limit the possible number of null bits. For example, the LTE standard limits the number of possible null bits to 0, 4, 8, 20 or 28. Obviously, there is no need to add and later remove null bits in case the bit streams originally contain full double words. Embodiments of the present invention are operable with any number of null bits. An exemplary matrix C, 300, of one of the bit streams (e.g., one of the systematic, parity 1 and parity 2 bit streams) that has been prepended with 21 null bits is presented in FIG. 3. Each row in FIG. 3 represents a double word of 32 bits, and null bits are presented as left diagonal lines. It can be seen that the null bits have been prepended in the beginning of the bit stream, in accordance with the LTE standard.

Figure 4:
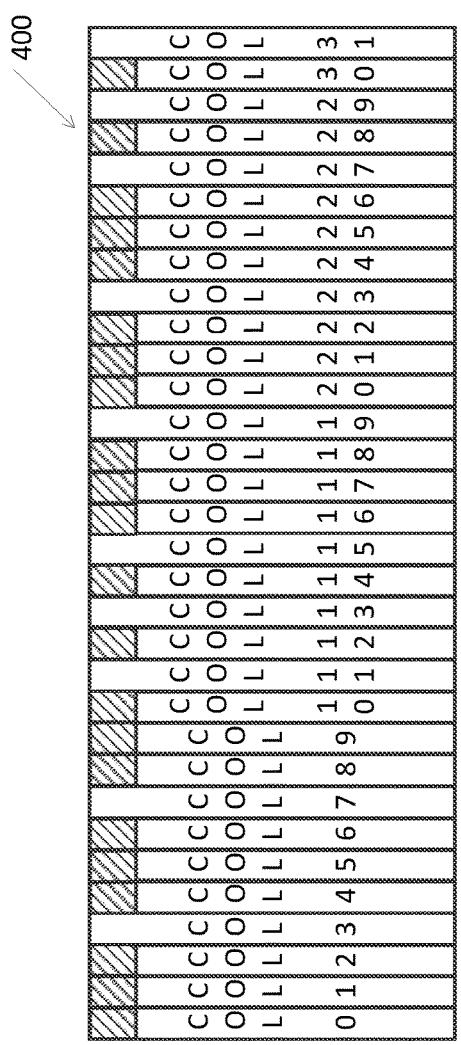
FIG. 4 depicts an exemplary matrix C of either the systematic bit stream or parity 1 bit stream that has been prepended with 21 null bits, after permutation, helpful in demonstrating embodiments of the present invention.

In operation 230 the systematic and the parity 1 bit streams may be rearranged or permuted, e.g., according to a first column permutation pattern. Permutation of a bit streams may include rehanging the columns of the matrix C. Permutation may be performed according to a permutation pattern defining how the rows are being rearranged, or according to a formula, or a combination thereof. In some cases a single permutation pattern may be presented in the form of a permutation pattern or in the form of a formula. The LTE standard defines a column permutation pattern for the systematic and the parity 1 bit streams. The first column permutation pattern may be given by T1={0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31}. FIG. 4 presents matrix C, 400, of either the systematic or the parity 1 bit streams after permutation.

In operation 240 the parity 2 bit stream may be permuted based on the first column permutation pattern. The parity 2 bit stream may be permuted according to a formula, e.g., as defined in the LTE standard. However, according to some embodiments of the present invention, the same permutation may be achieved using a second column permutation pattern, which is based on the column permutation pattern of the systematic and the parity 1 bit streams, followed by one cyclic rotation on a last row of the parity 2 bit stream that is performed after transposition, as will be discussed below the relation between the second column permutation pattern [T2] and the first permutation patterns [T1] may be given by:

$T2[0:15]=T1[16:31]$ $T2[16:23]=T1[8:15]$ $T2[24:27]=T1[4:7]$ $T2[28:29]=T1[2:3]$ $T2[30]=T2[1]$ $T2[31]=T2[0]$

The second column permutation pattern may be given by T2={1, 17, 9, 25, 5, 21, 13, 29, 3, 19, 11, 27, 7, 23, 15, 31, 2, 18, 10, 26, 6, 22, 14, 30, 4, 20, 12, 28, 8, 24, 16, 0}. FIG. 5 presents matrix C, 500, of the parity 2 bit stream after permutation.

It should be noted that while embodiments of the present invention are described with relation to the permutation patterns given in LTE rel. 12, embodiments of the present invention are not limited in this regards. Other permutation patterns may be used. According to some embodiments of the invention, other permutation patterns may be used as long as the first permutation pattern and the second permutation pattern differ in known or predictable locations.

According to some embodiments of the present invention, permutation of either the systematic, parity 1 or parity 2 matrices may be performed by a dedicated command. For example:

Permute_pattern1 rA,rB,rY,rZ

Where rA, rB, rY, rZ are 32-bit registers, rA, rB are input registers, each including a single row (e.g., a double word or 32 bits) of the C matrix that is being permuted, and rY, rZ are output registers providing the content of rA, rB following permutation using the first column permutation pattern, respectively. A similar commend may be defined for the second column permutation pattern. It should be readily understood that the above is only one demonstrative example of a possible command for implementing permutation, and that other commands may be used. In addition, the number of permuted rows, which is two (each including a double word) in the example above, is dictated by the hardware design. Embodiments of the present invention are not limited to a specific permutation method.

Figure 8:
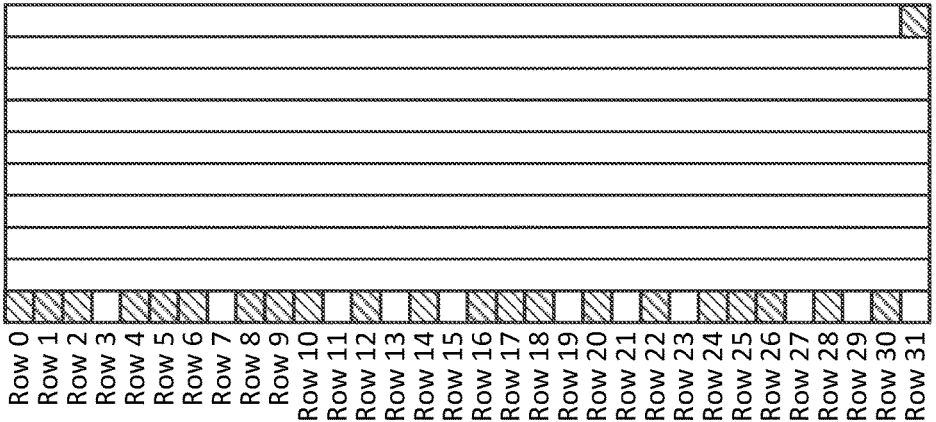
FIG. 8 depicts an exemplary transposed matrix, $C^T$, of parity 2 bit stream after the one cyclic rotation on a last row, helpful in demonstrating embodiments of the present invention.
Figure 7:
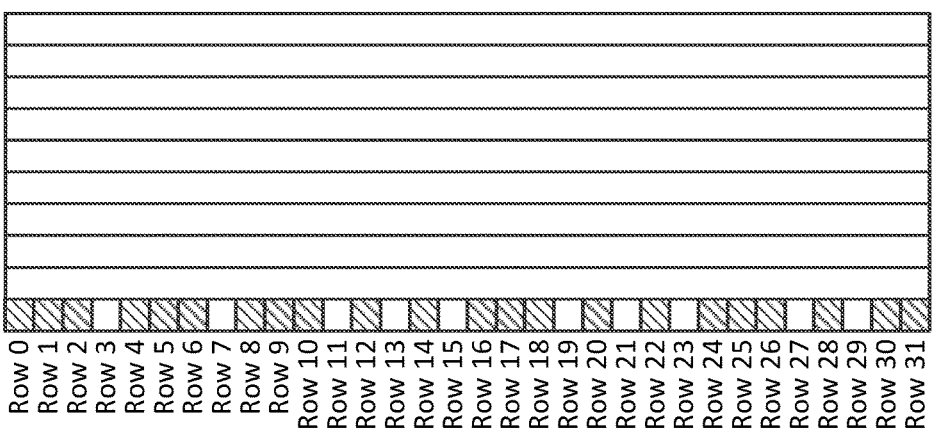
FIG. 7 depicts an exemplary transposed matrix, $C^T$, of parity 2 bit stream, helpful in demonstrating embodiments of the present invention.
Figure 6:
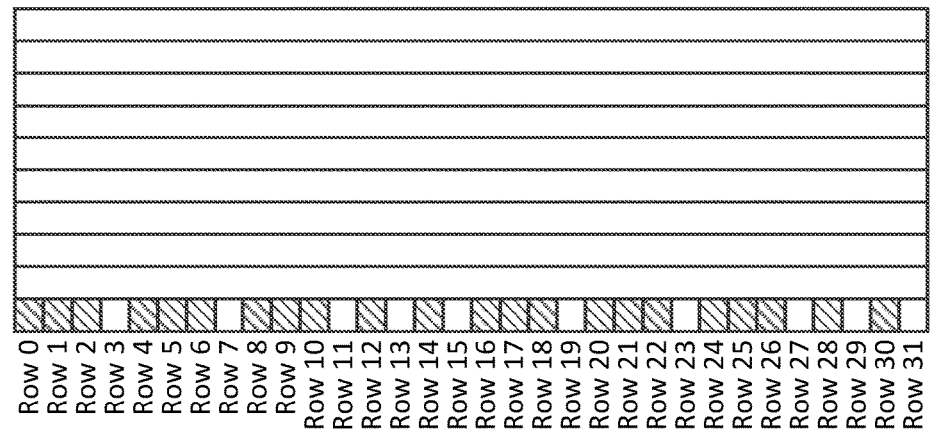
FIG. 6 depicts an exemplary transposed matrix, $C^T$, of either the systematic bit stream or parity 1 bit stream, helpful in demonstrating embodiments of the present invention.

In operation 250 the three bit streams may be transposed, or the C matrix of the three bit streams after permutation may be transposed, to generate $C^T$. The C matrices may undergo transpose operation where $[C^T]_{ij}=[C]_{ji}$. FIG. 6 presents the transposed matrix $C^T$, 600, of either the systematic or the parity 1 bit streams. FIG. 7 presents the transposed matrix $C^T$, 700, of parity 2 bit stream. As noted before, transposed matrix $C^T$ of the parity 2 bit stream may undergo one cyclic rotation on a last row after transposition to complete the permutation. FIG. 8 presents transposed matrix $C^T$, 800, of parity 2 bit stream after the one left cyclic rotation on a last row.

According to some embodiments of the present invention, the position of the null bits is identical for the transposed matrices $C^T$ of parity 1 and parity 2 streams except of two rows. The last row of $C^T$ of parity 2 includes a null bit at the end of the row, while the last row of $C^T$ of parity 1 does not include a null bit at all. In addition, there is a row in which $C^T$ of parity 1 stream includes a null bit and $C^T$ of parity 2 stream does not include a null bit. According to some embodiments of the present invention, the row number, referred to herein as the null index, in which $C^T$ of parity 1 stream includes a null bit and $C^T$ of parity 2 stream does not include a null bit depends on the number of null bits, e.g., the number of null bits prepended to each bit stream, denoted ND. Thus, the row in which $C^T$ of parity 1 stream includes a null bit and $C^T$ of parity 2 stream does not include a null bit does not depend on any other parameters such as the size of $C^T$. Since the number of null bits, ND, is known, the null index may be derived from ND. For example a look up table (LUT) may relate the number of null bits, ND, to the null index. An exemplary LUT for relating the number of null bits to the null index is presented in table 1. While table 1 presents only four possible values of ND, which are taken from the LTE standard, this LUT can be augmented to include each possible number of null bits, ranging from 1 to 31. Thus, the position of null bits may be derived from the number of null bits.

TABLE 1

An exemplary LUT relating a number of null bits to a null index.

| Number of null bits (ND) | Null index |
|---|---|
| 4 | 4 |
| 12 | 11 |
| 20 | 17 |
| 28 | 25 |

As can be seen in FIGS. 6, 8 the last row of $C^T$ of parity 2 stream includes a null bit at the end of the row, while the last row of $C^T$ of parity 1 stream does not include a null bit at all. In addition, row 21 of $C^T$ of parity 1 stream includes a null bit while row 21 of $C^T$ of parity 2 stream does not include a null bit.

Figure 9:
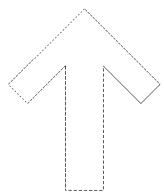
FIG. 9 depicts exemplary content of registers rA, rB containing data bits before transposition and registers rY, rZ containing data bits after transposition, according to embodiments of the present invention.

According to some embodiments of the present invention, transposition of either the systematic, parity 1 and parity 2 matrices may be performed by a dedicated command. For example:

Transpose rA,rB,rY,rZ

Where rA, rB, rY, rZ are 32-bit registers, rA, rB are input registers, each including 32 bits of the C matrix that is being transposed, and rY, rZ are output registers providing the content of rA, rB following transposition It should be readily understood that the above is only one demonstrative example of a possible command for implementing transposition, and that other commands may be used. In addition, the number of transposed bits, 64, in the example above, is dictated by the hardware design. Embodiments of the present invention are not limited to a specific transposition method. FIG. 9 depicts exemplary content of registers rA 910, rB 920 containing data bits before transposition and registers rY 930, rZ 940 containing data bits after transposition.

Figure 11:
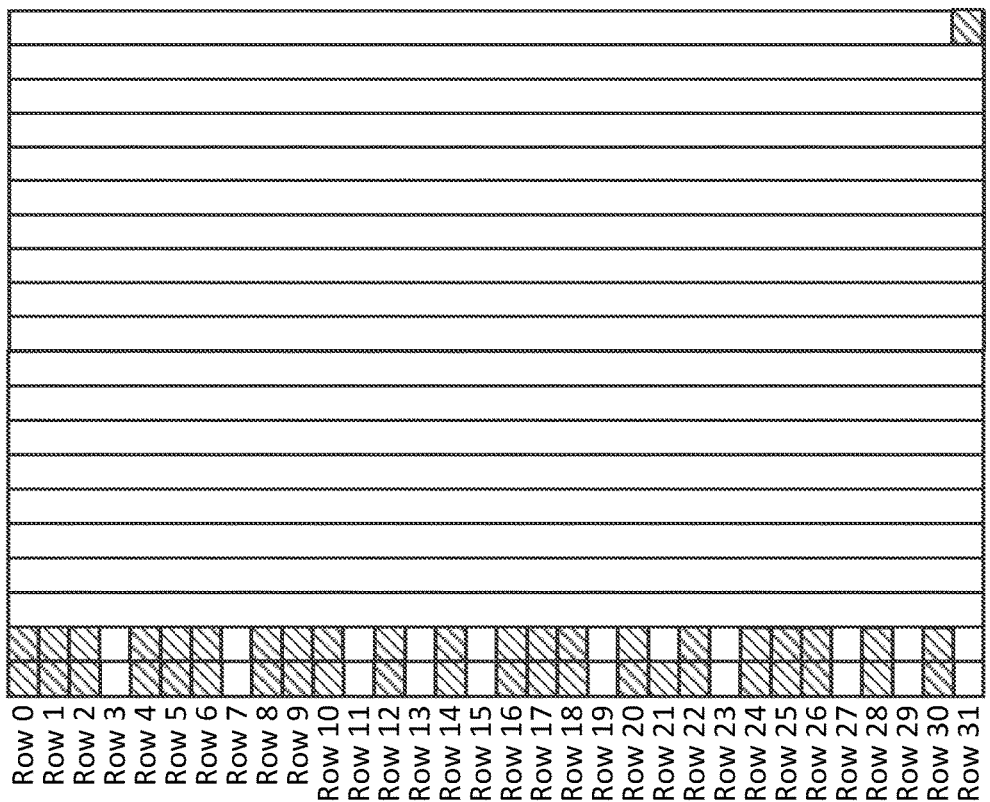
FIG. 11 depicts an exemplary shuffled bit stream, helpful in demonstrating embodiments of the present invention.

In operation 260 $C^T$ of parity 1 and parity 2 bit streams may be shuffled to generate a shuffled bit stream. Shuffling may include interleaving bits of $C^T$ of parity 1 and the parity 2 bit streams so that the shuffled bit stream may include a sequence of one bit from the parity 1 stream, one bit from the parity 2 bit stream, another bit from the parity 1 stream and so on. FIG. 11 presents shuffled bit stream 1110.

According to some embodiments of the present invention, shuffling of $C^T$ of parity 1 and parity 2 bit steams may be performed by a dedicated command. For example:

Shuffle rA,rB,rY,rZ

Where rA, rB, rY, rZ are 32-bit registers, rA, rB are input registers, one including bits of the parity 1 bit stream and the second including bits of the parity 2 bit stream, and rY, rZ are output registers providing the shuffled bit stream. In some embodiments 64 bits may be shuffled in a single computational cycle. Shuffling may be described by:

$rY[i] = rA[i/2]$ for $i$ even
$rB[(i-1)/2]$ for $i$ odd $rZ[i] = rA[16+i/2]$ for $i$ even
$rB[16+(i-1)/2]$ for $i$ odd Where i indicates bit index.

Figure 10:
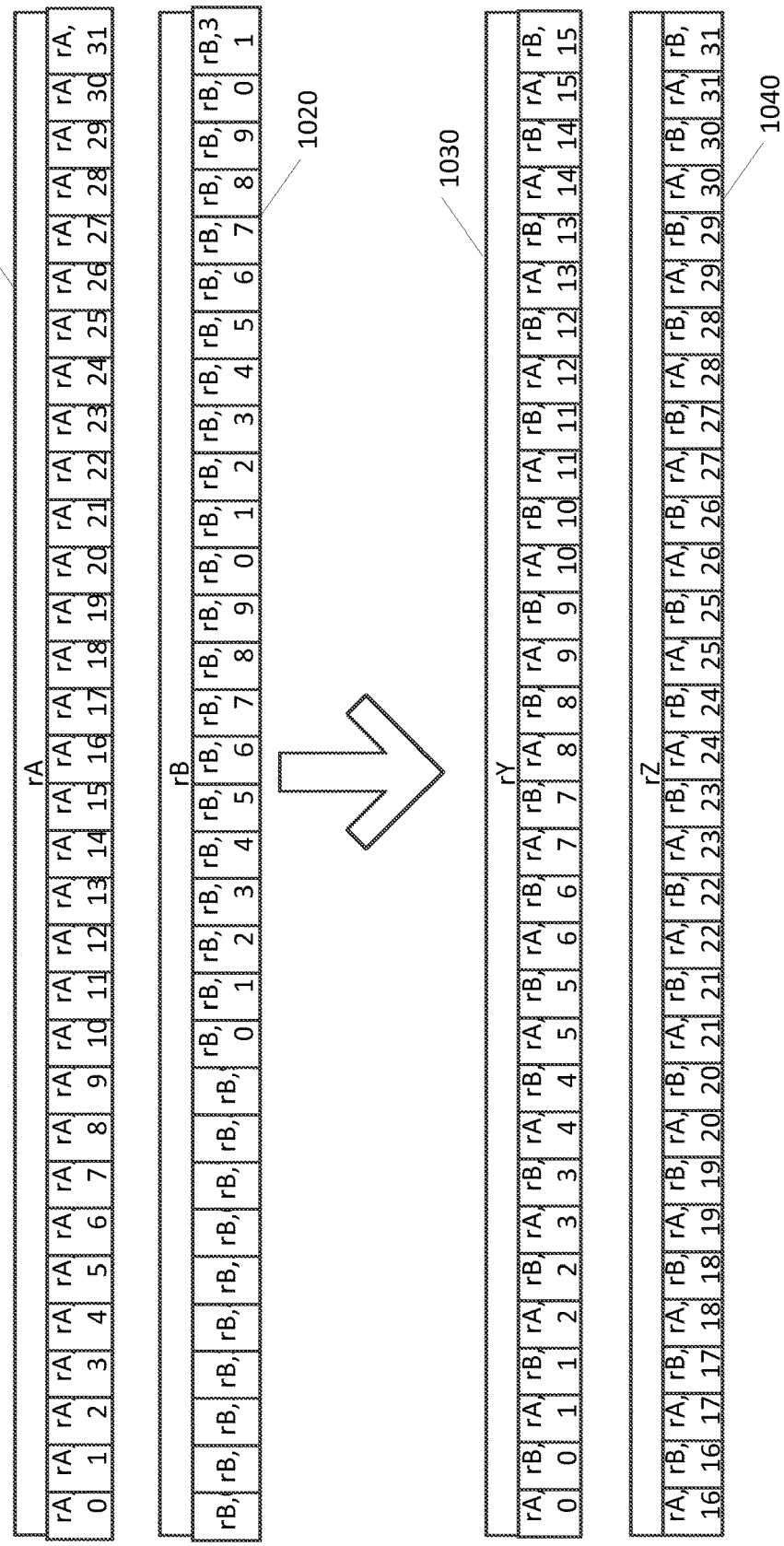
FIG. 10 depicts exemplary content of registers rA, rB containing data bits before shuffling and registers rY, rZ containing data bits after shuffling, according to embodiments of the present invention.

It should be readily understood that the above is only one demonstrative example of a possible command for implementing shuffling, and that other commands may be used. In addition, the number of shuffled bits, 64, in the example above, is dictated by the hardware design. Embodiments of the present invention are not limited to a specific shuffling method. FIG. 10 depicts exemplary content of registers rA 1010, rB 1030 containing data bits before shuffling and registers rY 1030, rZ 1040 containing data bits after shuffling.

In operation 270 null bits from $C^T$ of the systematic bit stream may be removed. The location of the null bits in $C^T$ of the systematic bit stream is based only on a number of prepended null bits and the first permutation pattern. Thus, null bits are removed from known locations.

In some embodiments removal of null bits may be done by reading each row of the $C^T$ of the systematic bit stream to a register and performing a left shift by one followed by concatenation operation to have continuous filled 32 bit words, prior to storing the data in the circular buffer. Alternatively, only the relevant bits, e.g., all bits except for the null bits may be read and placed into the circular buffer.

In operation 280 null bits from the shuffled bit stream may be removed. The location of the null bits in the shuffled bit stream is based only on the number of prepended null bits, the first permutation pattern, and a null index related to the number of prepended null bits. For example, in the shuffled bit stream null bits of parity 1 and parity 2 bit streams are located at the same rows except for the last row and another single row. For example, it may be known that the last bit in the last raw of the shuffled bit stream is a null bit. Therefore, the last bit in a last row of the shuffled bit stream may be removed. All other rows of the shuffled bit stream, except another row (e.g., all rows except for the last row and another row), either contain two null bits at the beginning of the row, e.g., the first two bits are null bits, or doesn't contain null bits at all. The location of rows that include two null bits is known based on the number of prepended null bits and the first permutation pattern. According to some embodiments of the present invention, there may be a single row (except for the last row) in which there is only a single null bit. This is the same row in which the parity 1 stream included a null bit and the parity 2 stream did not include a null bit. Thus, if the row number equals the null index, a single null bit should be removed from the shuffled bit stream.

Example logic behind some embodiments of the present invention may include the following. The number of null bits is known. The null bits are initially placed at the first row of the first ND columns of matrix C. T1 provides the permutation pattern of the parity 1 stream. Thus, looking at T1, it is evident that a null bit will be present in a column in which T1[i]<ND. After transposition of the C matrix, a null bit will be present in a row of $C^T$ in which T1[i]<ND. For example, if ND=21, T1[0]=0, T1[1]=16, and T1[2]=8, all of which are smaller than 21, thus, the first three rows of $C^T$ will contain null bits. T1[3]=24 which is bigger than 21, thus, the fourth row of $C^T$ will not contain a null bit, and so on. Despite that fact that the permutation is different for the parity 2 stream, the location of null bits is the same except for the last row and for the row in which the row number equals the null index (as pointed in the LUT). Thus, in the shuffled bit stream, in all other rows except for the last row and the row in which the row number equals the null index, two null bits will be present in rows in which T1[i]<ND. In the row in which the row number equals the null index only a single null bit is present.

It should be readily understood that other methods for removing the null bit may be used. For example, both the first and the second permutation patterns may be checked for each row. If the first permutation pattern shows that the row includes a null bit, a first bit in the row may be removed from that row, and if the second permutation pattern shows that the row includes a null bit, a second bit in the row may be removed from that row. In some embodiments this may be repeated for each row except for the last row in which the last bit is a null bit. Removing null bits based on the two permutation patterns may be used for uncorrelated permutation patterns.

Figure 12:
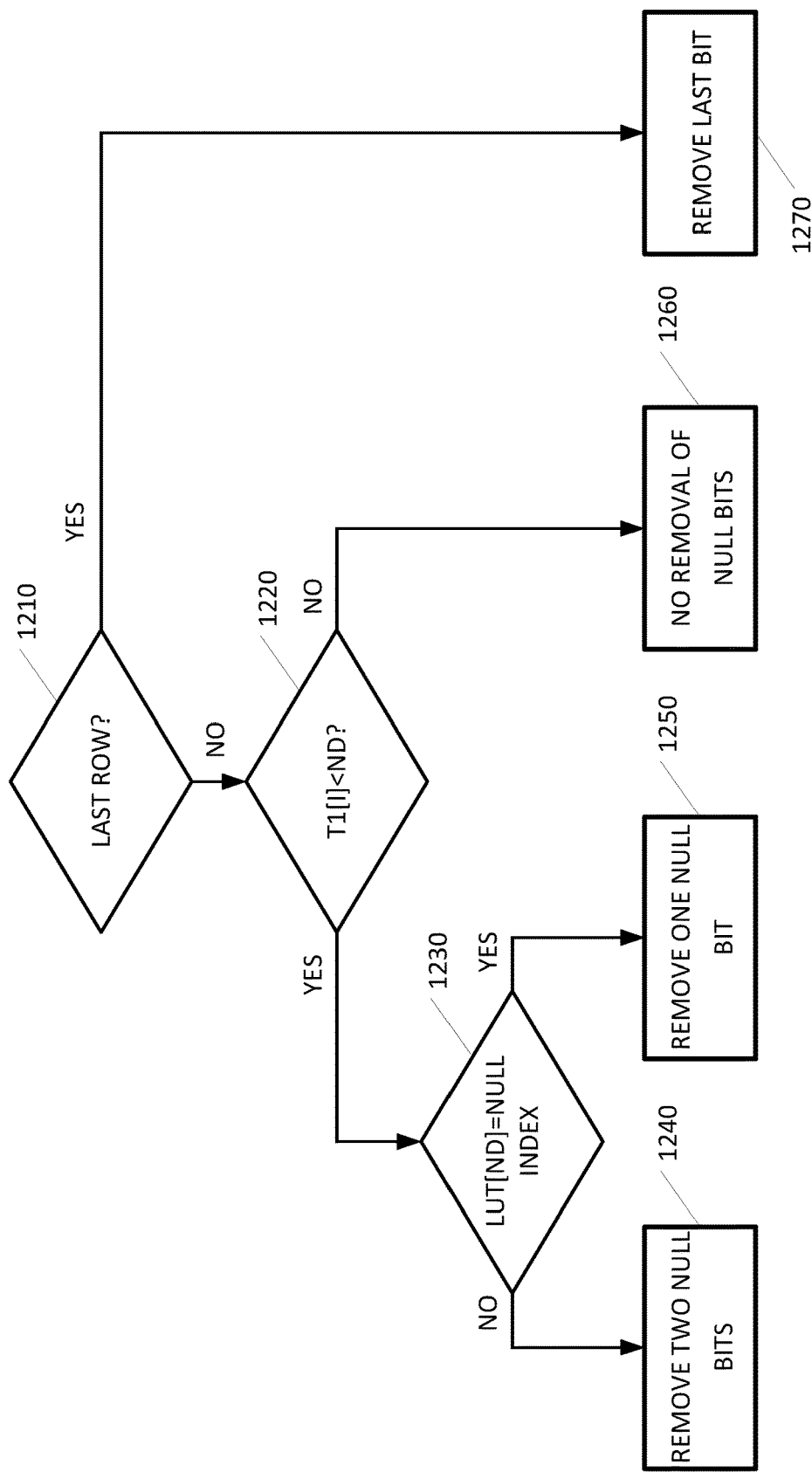
FIG. 12 is a flowchart diagram illustrating a method for removal of null bits, according to embodiments of the present invention.

Reference is now made to FIG. 12 which is a flowchart diagram illustrating a method for removal of null bits, according to embodiments of the present invention. FIG. 12 may be an elaboration of operation 280 presented in FIG. 2. Operations of FIG. 12 may be repeated for each row of the shuffled bit stream. In operation 1110 it is checked whether the row is the last row. If it is the last row, then the last bit in the row is removed, as indicated in operation 1270. If the row is not the last row, then it is checked whether the value in the first permutation pattern corresponding to the row number, T1[i], is smaller than ND. If T1[i] is not smaller (e.g., bigger or equal to) than ND, then no null bits should be removed. If T1[i] is smaller than ND, then it is verified whether the row number equals the null index. The null index is dependent on the number of nulls, ND. A LUT relating ND with the null index, as in table 1, may be used. Other methods for obtaining the null index based on ND may be used. If the row number equals the null index, then a first bit in the row (which is a null bit) should be removed, as indicated in operation 1250. If the row number does not equal the null index, then the first two bits in the row (which are null bits) should be removed, as indicated in operation 1240.

As explained above, the position of the null bits in the shuffled bit stream is known. Thus, null bits may be removed from their known locations. In some embodiments removal of null bits may be done by reading each row of the shuffled bit stream to a register and performing a left shift by one, to remove a single bit or left shift by two to remove two bits, followed by concatenation operation to have continuous filled 32 bit words, prior to storing the data in the circular buffer. Alternatively, only the relevant bits, e.g., all bits except for the null bits may be read and placed into the circular buffer.

Figure 13:
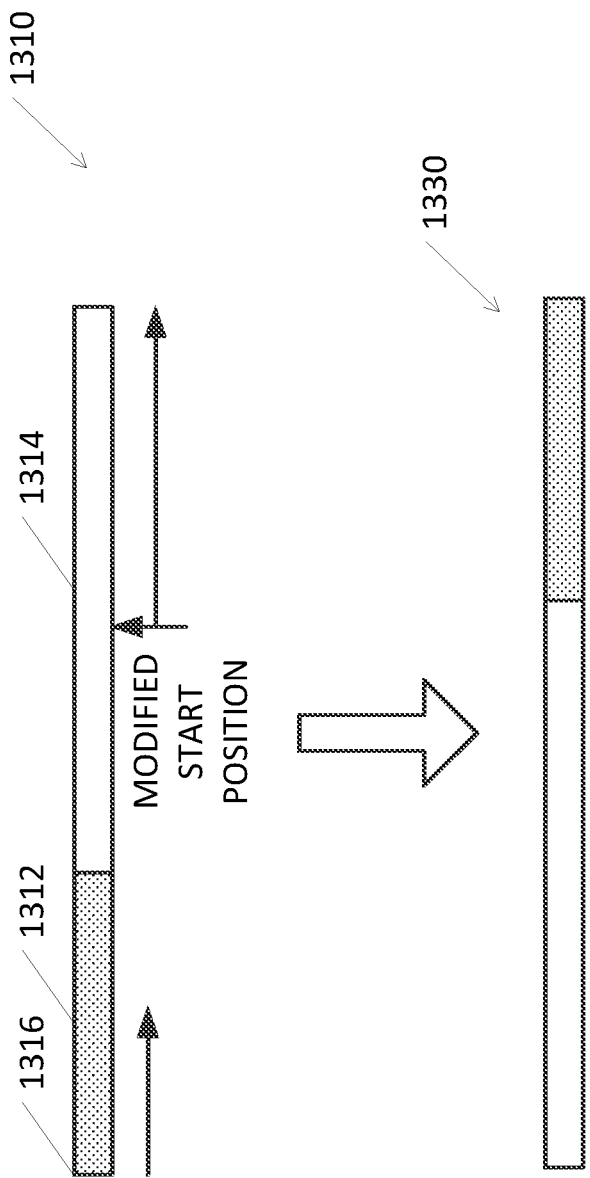
FIG. 13 depicts a circular buffer storing the combined bit stream, according to embodiments of the present invention.

Returning to FIG. 2, in operation 290 a combined bit stream may be generated from the systematic and the shuffled bit streams. For example, the bit streams may be read out row by row, as disclosed herein, first from $C^T$ of the systematic bit stream and then from the shuffled bit stream into a circular buffer from which bits may be passed on to next blocks of the transmitter to eventually be transmitted. FIG. 13 depicts a circular buffer 1310 storing the combined bit stream. On the left are bits of the systematic bit stream 1312 followed by bits of the shuffled bit stream 1314. According to embodiments of the present invention the combined bit stream does not include the null bits as those had already been removed.

However, removal of the null bits prior to generating combined bit stream in circular buffer 1310 may create a problem. According to the LTE standard, the bits selected for transmission may be read out starting from any point in circular buffer 1310. Reading may continue at the beginning of the circular buffer in case the end of the buffer is reached (wrapping around). The starting position may be given by a pointer referred to herein as the standard starting position. The problem is due to the fact that the standard starting position defined by the LTE standard assumes that the null bits were not already removed. Thus, according to some embodiments of the present invention, the standard starting position may have to be moved backwards (e.g., towards the first bit of the systematic bit stream) to a modified starting position. The pointer to the standard starting position may have to move backwards by the number of null bits that were removed between the beginning of the combined bit stream 1316 (e.g., the first bit of the systematic bit stream) and the standard starting position. The number of null bits that were removed between the beginning of the combined bit stream 1316 and the standard starting position may depend on the number of null bits and parity 1 permutation table, T1. Thus, in operation 292, a modified starting position may be calculated, for example, based on ND and parity 1 permutation table, T1. For example, the location of the standard starting position may be moved in order to compensate for the removal of the null bits. In operation 294, the combined bit stream may be transmitted, for example starting from the modified starting position and possibly continuing at the beginning of the circular buffer in case the end of the buffer is reached.

Figure 14:
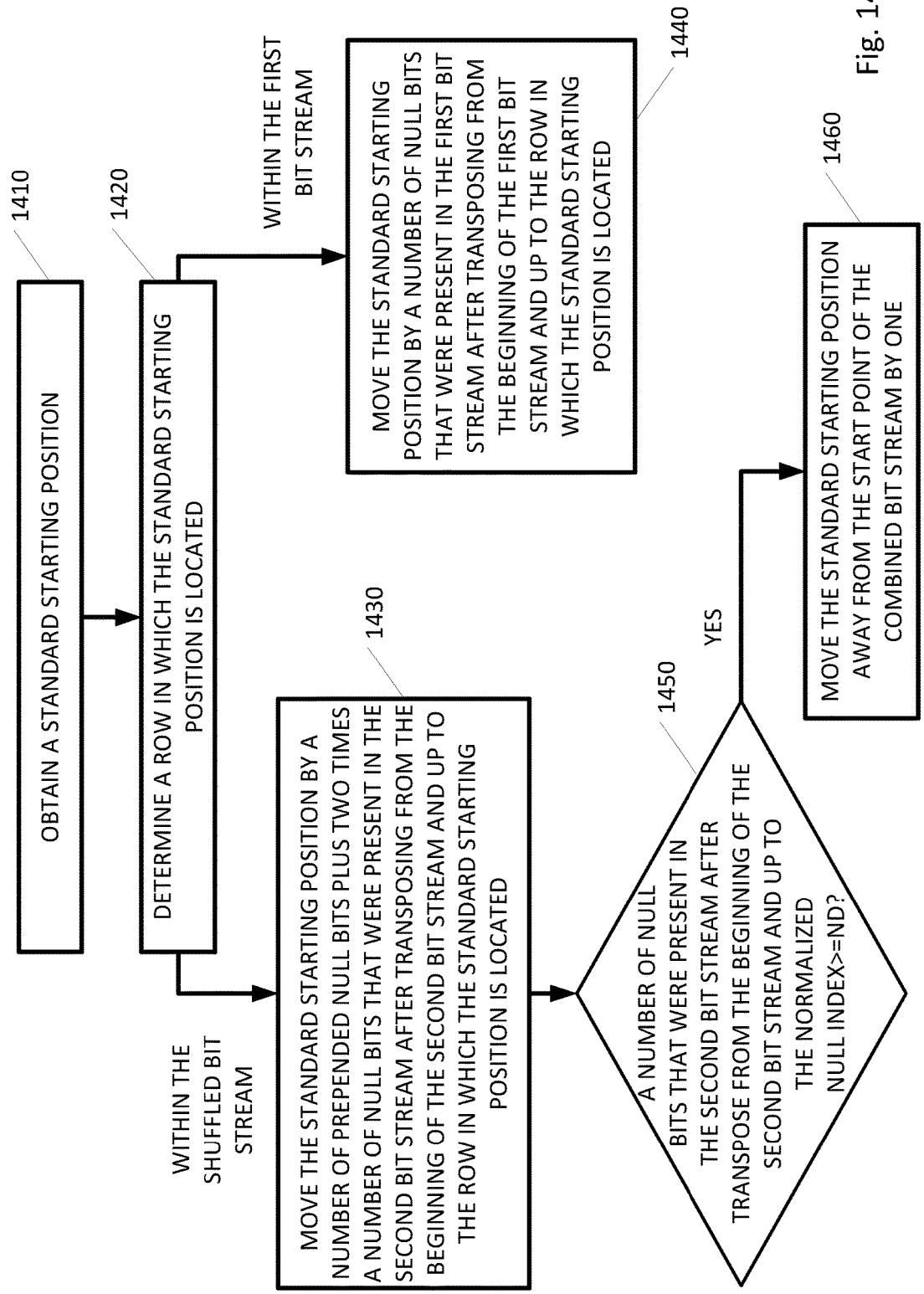
FIG. 14 is a flowchart diagram illustrating a method for generating a modified starting position, according to embodiments of the present invention.

Reference is now made to FIG. 14 which is a flowchart diagram illustrating a method for generating a modified starting position, according to embodiments of the present invention. FIG. 14 may be an elaboration of operation 292 presented in FIG. 2.

In operation 1410 a standard starting position for transmission of the combined bit stream may be obtained. The standard starting position may be correct for a standard combined bit stream which includes the null bits. Stated differently the standard starting position, denoted K, may be correct for a standard combined bit stream prior to removal of the null bits. FIG. 15 depicts a combined bit stream 1520 that was generated without removing the null bits. A standard starting position 1550 is given that is located in the systematic bit stream.

In operation 1420 a row in which the standard starting position is located may be determined. First it is determined if the standard starting position is located in the systematic bit stream or at the shuffled bit stream. If K is smaller than 32 times R then the standard starting position is located in the systematic bit stream. In this case the row number, Krow, equals the standard starting position divided by R:

if $K<32*R$, then $Krow=K/R$

Else the standard starting position is located in the shuffled bit stream and Krow equals:

$Krow=32+(K-32*R)/(2*R)=16+K/(2*R)$

In operation 1440, if the standard starting position is located in the systematic bit stream 1312, then the modified starting position may be obtained by moving the standard starting position towards a beginning 1316 of the combined bit stream by a number of null bits that were present in $C^T$ of the systematic bit stream from the beginning of $C^T$ and up to the row in which the standard starting position is located, Krow. It can be seen in FIG. 15 that two null bits 1526 are present between the standard starting position 1550 and a beginning of the first bit stream 1516. In order to obtain a modified starting position, the standard starting position 1550 may be moved by two bits towards a beginning 1516 of the combined bit stream 1520.

In operation 1430, if the standard starting position is located in the shuffled bit stream 1314, then the modified starting position may be obtained by moving the standard starting position towards a beginning 1316 of the combined bit stream by a number of prepended null bits, ND, plus two times a number of null bits that were present in $C^T$ of parity 1 bit stream from the beginning of $C^T$ of parity 1 bit stream and up to the row in which the standard starting position is located, Krow.

In operation 1450, it is checked whether a number of null bits that were present in $C^T$ of parity 1 bit stream from the beginning of $C^T$ of parity 1 bit stream and up to the row in which the standard starting position is located, Krow, is larger or equal to the null index. If so, than in operation 1460 the standard starting position may be moved away from the beginning point of the combined bit stream by one.

It should be readily understood that other methods may be used to adjust the standard starting position. For example, if the standard starting position is located in the shuffled bit stream 1314, then the modified starting position may be obtained by moving the standard starting position towards a beginning 1316 of the combined bit stream by a number of prepended null bits, ND, plus a number of null bits that were present in $C^T$ of parity 1 and of parity 2 bit streams from the beginning of $C^T$ of parity 1 and parity 2 bit streams and up to the row in which the standard starting position is located, Krow. Those embodiments may be suitable for uncorrelated permutation patterns.

FIG. 16 depicts combined bit stream 1520 that was generated without removing the null bits. In this example ND=4 Standard starting position 1650 is located in the shuffled bit stream 1324. It can be seen in FIG. 16 that four null bits 1626 are present in the systematic bit stream 1322, and another four null bits 1628 are present between the standard starting position 1650 and a beginning of the first bit stream 1516. In order to obtain a modified starting position, the standard starting position 1550 may be moved by eight bits towards a beginning 1516 of the combined bit stream 1520.

Figure 17:
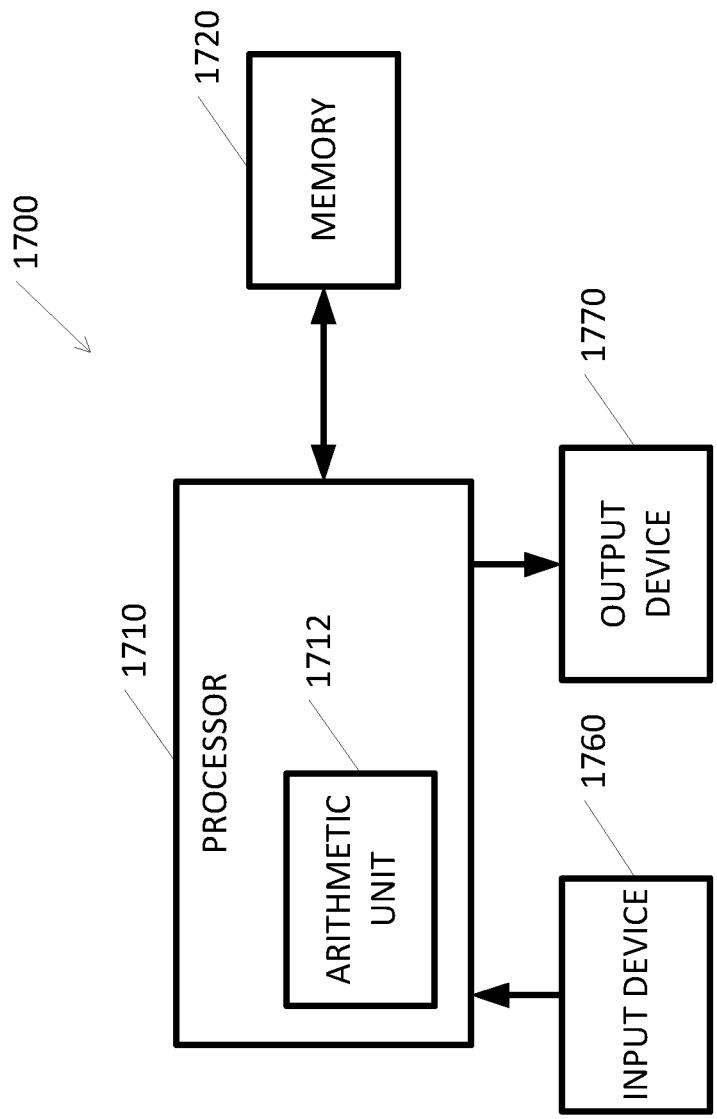
FIG. 17 is schematic illustration of an exemplary device according to embodiments of the invention.

Reference is made to FIG. 17, which is a schematic illustration of an exemplary device according to embodiments of the invention. A device 1700 may include a computer device having a wireless communication capabilities, including for example, a UE, e.g., UE 120, a smartphone, a cellular telephone or communications device, a cellular telephone, an IoT device or a Machine Type Communication (MTC) device, e.g., environment or industrial remote sensors, domestic sensors, wearables, etc., etc. Device 1700 may include any device capable of executing a series of instructions, for example for performing embodiments of the invention disclosed herein. Device 1700 may include an input device 1760 such as a mouse, a receiver, a keyboard, a microphone, a camera, a Universal Serial Bus (USB) port, a compact-disk (CD) reader, any type of Bluetooth input device, etc., and an output device 1770, for example, a transmitter or a monitor, projector, screen, printer, speakers, or display.

Device 1700 may include a processor 1710. Processor 1710 may include or may be a vector processor, a central processing unit (CPU), a digital signal processor (DSP), a microprocessor, a controller, a chip, a microchip, a field-programmable gate array (FPGA), an application-specific integrated circuit (ASIC) or any other integrated circuit (IC), or any other suitable multi-purpose or specific processor or controller. Processor 1710 may include an arithmetic unit 1712 configured to carry out embodiments described herein.

Device 1700 may include a memory unit 1720. Memory unit 1720 may be or may include any of a short-term memory unit and/or a long-term memory unit. Memory unit 1720 may include, for example, random access memory (RAM), dynamic RAM (DRAM), flash memory, volatile memory, non-volatile memory, a tightly-coupled memory (TCM), a buffer, a cache, such as an L-1 cache and/or an L-2 cache, or other suitable memory units or storage units. Memory unit 1720 may be implemented as separate (for example, "off-chip") or integrated (for example, "on-chip") memory unit, or as both.

Processor 1710 may request, retrieve, and process data stored in memory unit 1720, for example, the systematic, parity 1 and parity 2 bit steams, a LUT relating a number of null bits to a null index, a first permutation pattern, etc., and may control, in general, the pipeline flow of operations or instructions executed on the data. Processor 1710 may receive instructions, for example, from a program memory (for example, in memory unit 1720 to perform methods disclosed herein). According to some embodiments of the present invention, processor 1710 may receive instructions to perform rate matching as described herein.

Embodiments of the invention may be implemented for example on an integrated circuit (IC), for example, by constructing processor 1710, as well as other components of FIG. 4 in an integrated chip or as a part of an chip, such as an ASIC, an FPGA, a CPU, a DSP, a microprocessor, a controller, a chip, a microchip, etc.

According to embodiments of the present invention, some units e.g., processor 1710, as well as the other components of FIG. 17, may be implemented in a hardware description language (HDL) design, written in Very High Speed Integrated Circuit (VHSIC) hardware description language (VHDL), Verilog HDL, or any other hardware description language. The HDL design may be synthesized using any synthesis engine such as SYNOPSYS® Design Compiler 2000.05 (DC00), BUILDGATES® synthesis tool available from, inter alia, Cadence Design Systems, Inc. An ASIC or other integrated circuit may be fabricated using the HDL design. The HDL design may be synthesized into a logic level representation, and then reduced to a physical device using compilation, layout and fabrication techniques, as known in the art.

Embodiments of the present invention may include a computer program application stored in non-volatile memory, non-transitory storage medium, or computer-readable storage medium (e.g., hard drive, flash memory, CD ROM, magnetic media, etc.), storing instructions that when executed by an arithmetic unit of a processor (e.g., arithmetic unit 1712 of processor 1710) carry out embodiments of the invention. Processor 1710 and arithmetic unit 1712 may be configured to carry out embodiments described herein by for example executing software or instructions.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A method for performing rate matching for three equally sized bit streams, the method comprising, in a device used to communicate over a wireless communication network, using a processor coupled to a memory, the processor comprising a logic circuit, the logic circuit comprising an arithmetic unit:
   retrieving using the processor a first permutation pattern from the memory;
   prepending each of the three bit streams with null bits;
   permuting the first two bit streams according to the first permutation pattern;
   permuting the third bit stream based on the first permutation pattern;
   transposing the three bit streams;
   shuffling the second and the third bit streams to generate a shuffled bit stream;
   removing the null bits from the first bit stream, wherein location of the null bits in the first bit stream is based only on a number of prepended null bits and the first permutation pattern;
   removing the null bits from the shuffled bit stream, wherein location of the null bits in the shuffled bit stream is based only on the number of prepended null bits, the first permutation pattern, and a null index related to the number of prepended null bits;
   generating a combined bit stream from the three bit streams; and
   transmitting the combined bit stream.

2. The method of claim 1, wherein removing the null bits from the shuffled bit stream comprises:
   removing a last bit in a last row of the shuffled bit stream; and
   in all rows of the shuffled bit stream except for the last row:
      if a value in the first permutation pattern corresponding to a row number is smaller than the number of prepended null bits, then if the row number equals the null index, removing a first bit in the row, and if the row number does not equal the null index removing a first two bits in the row.

3. The method of claim 1, wherein permutation of the third stream is performed according to a formula.

4. The method of claim 1, wherein permutation of the third bit stream comprises:
   permuting the third bit stream according to a second permutation pattern; and
   after transposing, performing one left cyclic rotation on a last row of the third bit stream.

5. The method of claim 4, wherein the second permutation pattern is related to the first permutation pattern such that in the shuffled bit stream null bits of the second and third bit streams are located at the same rows, except in the last row in which the last bit is a null bit, and a single row in which there is only a single null bit.

6. The method of claim 1, comprising:
   obtaining a standard starting position for transmission of the combined bit stream, wherein the standard starting position is correct for a standard combined bit stream which includes the null bits; and
   moving a location of the standard starting position to compensate for the removal of the null bits, to obtain a modified starting position.

7. The method of claim 6, comprising:
   determining in which row the standard starting position is located;
   if the standard starting position is within the first bit stream, moving the standard starting position towards a beginning of the combined bit stream by a number of null bits that were present in the first bit stream after transposing from the beginning of the first bit stream and up to the row in which the standard starting position is located;
   if the standard starting position is within the shuffled bit stream, moving the standard starting position towards the beginning of the combined bit stream by a number of prepended null bits plus two times a number of null bits that were present in the second bit stream after transposing from the beginning of the second bit stream and up to the row in which the standard starting position is located; and if a number of null bits that were present in the second bit stream after transposing from the beginning of the second bit stream and up to the row in which the standard starting position is located is larger or equal to the null index, moving the standard starting position away from the beginning of the combined bit stream by one.

8. The method of claim 7, wherein the row in which the standard starting position is located is calculated by:
if the standard starting position is smaller than the number of bits in the first bit stream then the row in which the standard starting position is located equals an integer part of dividing the standard starting position by the number of rows in the first bit stream; and
otherwise, the row in which the standard starting position is located equals B+(K−B*R)/(2*R), where K is the standard starting position, R is the number of rows, and B is a number of bits in each row in the first bit stream.

9. The method of claim 6, wherein transmitting the combined bit stream starts from the corrected starting position.

10. The method of claim 1, wherein the first bit stream is a systematic bit stream, the second bit stream is a parity 1 bit stream and the third bit stream is a parity 2 bit stream.

11. A method for performing rate matching for three equally sized bit streams, the method comprising, in a device used to communicate over a wireless communication network, using a processor coupled to a memory, the processor comprising a logic circuit, the logic circuit comprising an arithmetic unit:
retrieving using the processor a first permutation pattern from the memory;
prepending each of the three bit streams with null bits;
permuting the first two bit streams according to the first permutation pattern;
permuting the third bit stream according to a second permutation pattern;
transposing the three bit streams;
shuffling the second and the third bit streams to generate a shuffled bit stream;
removing the null bits from the first bit stream, wherein location of the null bits in the first bit stream is based only on a number of prepended null bits and the first permutation pattern;
removing the null bits from the shuffled bit stream, wherein location of the null bits in the shuffled bit stream is based only on the number of prepended null bits, the first permutation pattern, and the second permutation table;
generating a combined bit stream from the three bit streams; and
transmitting the combined bit stream.

12. A logic circuit in a processor in a device used to communicate over a wireless communication network, the processor coupled to a memory, the logic circuit comprising:
a plurality of registers;
a memory, the processor to retrieve a first permutation pattern from the memory; and
an arithmetic unit configured to:
receive three equally sized bit streams;
prepend each of the three bit streams with null bits;
permute the first two bit streams according to the first permutation pattern;
permute the third bit stream based on the first permutation pattern;
transpose the three bit streams;
shuffle the second and the third bit streams to generate a shuffled bit stream;
remove the null bits from the first bit stream, wherein location of the null bits in the first bit stream is based only on a number of prepended null bits and the first permutation pattern;
remove the null bits from the shuffled bit stream, wherein location of the null bits in the shuffled bit stream is based only on the number of prepended null bits, the first permutation pattern, and a null index related to the number of prepended null bits;
generate a combined bit stream from the three bit streams; and
transmit the combined bit stream.

13. The logic circuit of claim 12, wherein the arithmetic unit is configured to remove the null bits from the shuffled bit stream by:
removing a last bit in a last row of the shuffled bit stream; and
in all rows of the shuffled bit stream except for the last row:
if a value in the first permutation pattern corresponding to a row number is smaller than the number of prepended null bits, then if the row number equals the null index, removing a first bit in the row, and if the row number does not equal the null index removing a first two bits in the row.

14. The logic circuit of claim 12, wherein the arithmetic unit is configured to permute the third bit stream by:
permuting the third bit stream according to a second permutation pattern; and
after transposing, performing one left cyclic rotation on a last row of the third bit stream.

15. The logic circuit of claim 14, wherein the second permutation pattern is related to the first permutation pattern such that in the shuffled bit stream null bits of the second and third bit streams are located at the same rows, except in the last row in which the last bit is a null bit, and a single row in which there is only a single null bit.

16. The logic circuit of claim 12, wherein the arithmetic unit is configured to:
obtain a standard starting position for transmission of the combined bit stream, wherein the standard starting position is correct for a standard combined bit stream which includes the null bits; and
move a location of the standard starting position to compensate for the removal of the null bits, to obtain a modified starting position.

17. The logic circuit of claim 16, wherein the arithmetic unit is configured to:
determine in which row the standard starting position is located;
if the standard starting position is within the first bit stream, move the standard starting position towards a beginning of the combined bit stream by a number of null bits that were present in the first bit stream after transposing from the beginning of the first bit stream and up to the row in which the standard starting position is located;
if the standard starting position is within the shuffled bit stream, move the standard starting position towards the beginning of the combined bit stream by a number of prepended null bits plus two times a number of null bits that were present in the second bit stream after transposing from the beginning of the second bit stream and up to the row in which the standard starting position is located; and if a number of null bits that were present in the second bit stream after transposing from the beginning of the second bit stream and up to the row in which the standard starting position is located is larger or equal to the null index, move the standard starting position away from the beginning of the combined bit stream by one.

18. The logic circuit of claim 17, wherein the arithmetic unit is configured to calculate the row in which the standard starting position is located by:
    if the standard starting position is smaller than the number of bits in the first bit stream then the row in which the standard starting position is located equals an integer part of dividing the standard starting position by the number of rows in the first bit stream; and
    otherwise, the row in which the standard starting position is located equals $B+(K-B*R)/(2*R)$, where K is the standard starting position, R is the number of rows, and B is a number of bits in each row in the first bit stream.

19. The logic circuit of claim 16, wherein the arithmetic unit is configured to transmit the combined bit stream starting from the corrected starting position.

20. The logic circuit of claim 12, wherein the first bit stream is a systematic bit stream, the second bit stream is a parity 1 bit stream and the third bit stream is parity 2 bit stream.

* * * * *